United States Patent
Liao et al.

(10) Patent No.: US 11,917,828 B2
(45) Date of Patent: Feb. 27, 2024

(54) MEMORY DEVICES WITH MULTIPLE STRING SELECT LINE CUTS

(71) Applicant: Macronix International Co., Ltd., Hsinchu (TW)

(72) Inventors: Ting-Feng Liao, Hsin-chu (TW); Mao-Yuan Weng, Hualien (TW); Kuang-Wen Liu, Hsin-chu (TW)

(73) Assignee: Macronix International Co., Ltd., Hsinchu (TW)

( * ) Notice: Subject to any disclaimer, the term of this patent is extended or adjusted under 35 U.S.C. 154(b) by 420 days.

(21) Appl. No.: 17/314,528

(22) Filed: May 7, 2021

(65) Prior Publication Data
US 2022/0359556 A1 Nov. 10, 2022

(51) Int. Cl.
| | |
|---|---|
| *H10B 41/00* | (2023.01) |
| *H10B 43/50* | (2023.01) |
| *H01L 23/522* | (2006.01) |
| *H01L 21/768* | (2006.01) |
| *H10B 41/27* | (2023.01) |

(Continued)

(52) U.S. Cl.
CPC ....... *H10B 43/50* (2023.02); *H01L 21/76877* (2013.01); *H01L 23/5226* (2013.01); *H10B 41/27* (2023.02); *H10B 41/35* (2023.02); *H10B 41/50* (2023.02); *H10B 43/27* (2023.02); *H10B 43/35* (2023.02)

(58) Field of Classification Search
CPC ........ H10B 41/10; H10B 41/27; H10B 41/35; H10B 43/10; H10B 43/27; H10B 43/35
See application file for complete search history.

(56) References Cited

U.S. PATENT DOCUMENTS

| | | |
|---|---|---|
| 9,548,121 B2 | 1/2017 | Lee et al. |
| 2012/0224426 A1 | 9/2012 | Nam et al. |

(Continued)

FOREIGN PATENT DOCUMENTS

| | | |
|---|---|---|
| TW | 201721921 | 6/2017 |
| TW | 201834150 | 9/2018 |

(Continued)

OTHER PUBLICATIONS

"Occupies." Merriam-Webster.com. 2023. https://www.merriam-webster.com (Sep. 22, 2023). (Year: 2023).*

*Primary Examiner* — Reema Patel
(74) *Attorney, Agent, or Firm* — Fish & Richardson P.C.

(57) ABSTRACT

Methods, systems and apparatus for memory devices with multiple string select line (SSL) cuts are provided. In one aspect, a semiconductor device includes: a three-dimensional (3D) array of memory cells and a plurality of common source lines (CSLs) configured to separate the 3D array of memory cells into a plurality of portions. Each portion of the plurality of portions is between two adjacent CSLs and includes a plurality of conductive layers separated from each other by insulating layers and a plurality of vertical channels arranged orthogonally through the plurality of conductive layers and the insulating layers, each of the plurality of vertical channels including a string of memory cells. A top part of each portion of one or more portions includes at least two SSL cuts configured to separate the portion into multiple independent units, and each of the independent units is selectable by a corresponding SSL of multiple SSLs.

19 Claims, 13 Drawing Sheets

(51) Int. Cl.
  *H10B 41/35*   (2023.01)
  *H10B 41/50*   (2023.01)
  *H10B 43/27*   (2023.01)
  *H10B 43/35*   (2023.01)

(56) References Cited

U.S. PATENT DOCUMENTS

2016/0064454 A1    3/2016  Park
2017/0125109 A1    5/2017  Park et al.
2018/0102375 A1    4/2018  Pang et al.
2018/0358370 A1*  12/2018  Hwang ................. H10B 41/27
2020/0098774 A1    3/2020  Yeh et al.
2021/0366825 A1*  11/2021  Shin ....................... H01L 23/58

FOREIGN PATENT DOCUMENTS

TW    201913967      4/2019
TW    201944541     11/2019
TW    202044555     12/2020
TW    202115881      4/2021

* cited by examiner

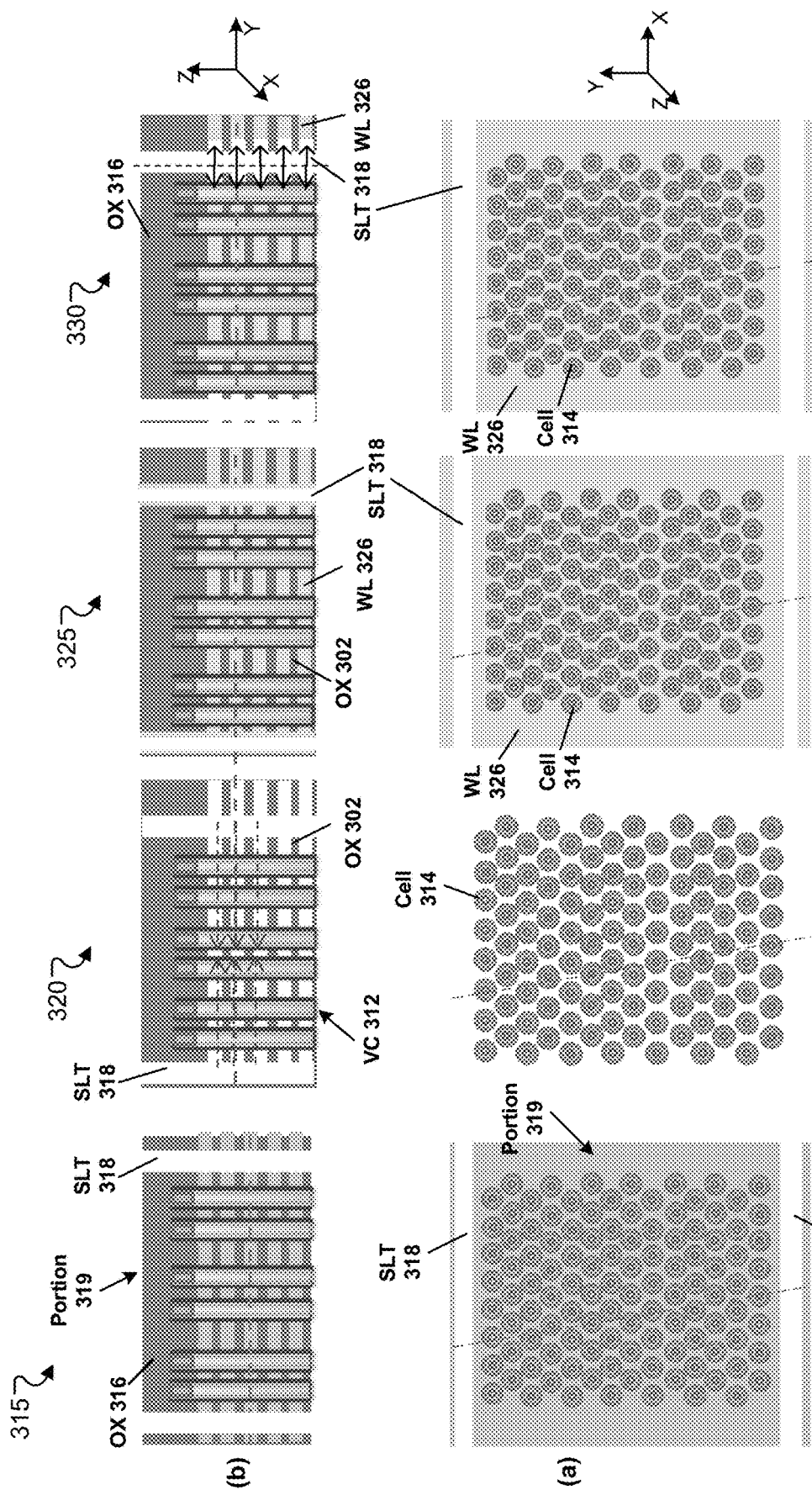

MEMORY DEVICES WITH MULTIPLE STRING SELECT LINE CUTS

BACKGROUND

Memory devices, e.g., high-density NAND flash memory devices, can have various structures to increase a density of memory cells and lines on a chip. For example, three-dimensional (3D) NAND structures are attractive due to their capability to increase an array density by stacking more layers within a similar footprint. As the more layers are stacked, a pitch between elements increases thereby also decreasing a number of elements horizontally oriented, which may limit the scalability of the 3D structures.

SUMMARY

The present disclosure describes methods, systems, and techniques for memory devices with multiple string select line (SSL) cuts, e.g., with two or more SSL cuts between two adjacent common source lines (CSLs), which can increase an efficiency of the memory devices.

One aspect of the present disclosure features a semiconductor device including: a three-dimensional (3D) array of memory cells and a plurality of common source lines (CSLs) configured to separate the 3D array of memory cells into a plurality of portions. Each portion of the plurality of portions is between two adjacent CSLs and includes: a plurality of conductive layers separated from each other by insulating layers and a plurality of vertical channels arranged orthogonally through the plurality of conductive layers and the insulating layers, each of the plurality of vertical channels including a string of memory cells. A top part of each portion of one or more portions of the plurality of portions includes at least two string select line (SSL) cuts configured to separate the portion into multiple independent units, and where each of the multiple independent units is selectable by a corresponding SSL of multiple SSLs. The multiple SSLs can be associated with the SSL cuts.

In some embodiments, for each portion of the one or more portions, each SSL cut of the at least two SSL cuts is filled with an insulating material and configured to separate two adjacent units of the portion. The insulating material of the SSL cut occupies a top part of at least one vertical channel of the plurality of vertical channels. The top part of the at least one vertical channel can correspond to the top part of the portion.

In some embodiments, for each portion of the one or more portions, each SSL cut of the at least two SSL cuts, extends continuously along a direction without separation by one or more vertical channels along the direction in the portion.

In some embodiments, the SSL cut is filled with an insulating material, and the insulating material of the SSL occupies top parts of the one or more vertical channels along the direction in the portion.

In some embodiments, for each portion of the one or more portions, each SSL cut of the at least two more SSL cuts extends to a depth of the top part of the portion but not beyond a bottom insulating layer, the SSL cut being arranged orthogonally through one or more conductive layers above the bottom insulating layer. The depth of the top part can be smaller than a depth of a vertical channel.

In some embodiments, each of the one or more conductive layers is a respective SSL of the multiple SSLs and configured to select a corresponding unit of the multiple independent units.

In some embodiments, memory cells in a conductive layer above the bottom insulating layer are separated into the multiple independent units by the SSL cuts, and memory cells in a conductive layer below the bottom insulating layer are conductively connected without separation by the SSL cuts.

In some embodiments, the semiconductor device further includes a common conductive layer on a substrate, and the plurality of CSLs and the plurality of vertical channels are conductively coupled to the common conductive layer on the substrate.

In some embodiments, each string of memory cells is conductively coupled to a respective bit line through a conductive via, and each of the plurality of vertical channels includes a respective bit line pad conductively coupled to a corresponding conductive via.

In some embodiments, a width of each of the CSLs is larger than a width of each of the SSL cuts.

In some embodiments, the width of each of the SSL cuts is smaller than a width of each of the plurality of vertical channels.

Another aspect of the present disclosure features a semiconductor device including: a three-dimensional (3D) array of memory cells; and a plurality of common source lines (CSLs) configured to separate the 3D array of memory cells into a plurality of portions, each portion of the plurality of portions being between two adjacent CSLs and including: a plurality of conductive layers separated from each other by insulating layers; and a plurality of vertical channels being arranged orthogonally through the plurality of conductive layers and the insulating layers, each of the plurality of vertical channels including a string of memory cells. A top part of each portion of one or more portions of the plurality of portions includes one or more string select line (SSL) cuts configured to separate the portion into multiple independent units, and each SSL cut of the one or more SSL cuts is filled with an insulating material and configured to separate two adjacent units of the portion, and where the insulating material of the SSL cut occupies a top part of at least one vertical channel of the plurality of vertical channels.

A further aspect of the present disclosure features a method of forming a semiconductor device, including: forming a plurality of vertical channels through a plurality of alternating pairs of first and second layers on a substrate, the first layers being electrically insulating; forming a plurality of source line trenches (SLTs) to separate the plurality of vertical channels into a plurality of portions, each portion of the plurality of portions being between two adjacent SLTs; forming conductive layers between adjacent first layers in each portion of the plurality of portions by replacing the second layers with a conductive material between the adjacent first layers; then forming one or more string select line (SSL) cuts in a top part of each portion of one or more portions of the plurality of portions, the one or more SSL cuts being configurable to separate the portion into multiple independent units.

In some embodiments, the method further includes: forming a plurality of common source lines (CSLs) in the plurality of SLTs. Forming the one or more SSL cuts in the top part of each portion of the one or more portions can include: after forming the plurality of CSLs, forming the one or more SSL cuts in the top part of the portion between two corresponding adjacent CSLs, each of the one or more SSL cuts being configurable to separate two adjacent independent units in the portion.

In some embodiments, forming the plurality of CSLs in the plurality of SLTs includes: etching the conductive material around the plurality of SLTs; depositing an insulating material into interior areas of the plurality of SLTs; and depositing the conductive material in the SLTs to form the plurality of CSLs, where the insulating material is configured to isolate the CSLs from the conductive layers.

In some embodiments, forming the one or more SSL cuts in the top part of each portion of the one or more portions includes: etching the top part of the portion to form one or more openings corresponding to the one or more SSL cuts; and filling an insulating material into the one or more openings to form the one or more SSL cuts.

In some embodiments, etching the top part of the portion to form the one or more openings corresponding to the one or more SSL cuts includes: etching a top part of one or more vertical channels corresponding to the one or more SSL cuts, and filling the insulating material into the one or more openings to form the one or more SSL cuts includes: filling the insulating material the top part of the one or more vertical channels.

In some embodiments, for each portion of the one or more portions, each SSL cut extends to a depth of the top part of the portion but not beyond a bottom first layer in the top part. The SSL cut can be arranged orthogonally through one or more conductive layers of the conductive layers above the bottom first layer, and each of the one or more conductive layers can form a respective SSL of multiple SSLs and configured to select a corresponding unit of the multiple independent units.

In some embodiments, a number of the multiple SSLs is identical to a number of the multiple independent units.

In some embodiments, forming the one or more SSL cuts in the top part of each portion of the one or more portions includes: forming the one more SSL cuts to separate memory cells in the one or more conductive layers above the bottom first layer into the multiple independent units. Memory cells in a conductive layer below the bottom first layer can be conductively connected without separation by the SSL cuts.

In some embodiments, forming the plurality of vertical channels through a plurality of alternating pairs of first and second layers includes: vertically etching through the plurality of alternating pairs of first and second layers to form a plurality of holes; forming multiple transistor layers in the plurality of holes to form strings of memory cells; and forming conductive bit line pads on top of the strings of memory cells.

In some embodiments, forming the conductive layers between the adjacent first layers in each portion of the plurality of portions includes: selectively etching the second layers by flowing an etching solution from the SLTs towards the second layers to form spacings between the adjacent first layers; and depositing the conductive material to fill the spacings between the adjacent first layers.

The techniques implemented in the present disclosure can make two or more SSL cuts between two adjacent CSLs, which can gain more chip areas to include more vertical channels (thus strings) by reducing the number of CSLs. The SSL cuts can guarantee that adjacent units separated by each SSL cut (e.g., adjacent blocks or sub-blocks) are independent and isolated from each other, and thus can be independently selectable or controllable. The techniques enable forming the SSL cuts after forming word lines or after gate replacement, which can address open word line issues (e.g., due to residue insulating materials in the word lines) caused by forming the SSL cuts before the word lines are formed or the gates are replaced.

The techniques implemented in the present disclosure can be applied to various memory types, such as SLC (single-level cell) devices, MLC (multi-level cell) devices like 2-level cell devices, TLC (triple-level cell) devices, or QLC (quad-level cell) devices. The techniques can be applied to various dimensions of memory systems, such as three-dimensional (3D) memory systems. The techniques can be applied to various types of non-volatile memory systems, such as Mask Read-Only Memory, Programmable Read-Only Memory, Erasable Programmable Read-Only Memory, Electrically Erasable Programmable Read-Only Memory, and Flash Memory. The flash memory can include NAND flash memory, NOR flash memory, among others. Additionally or alternatively, the techniques can be applied to various types of devices and systems, such as secure digital (SD) cards, embedded multimedia cards (eMMC), or solid-state drives (SSDs), embedded systems, media players, mobile devices, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

Like reference numbers and designations in the various drawings indicate like elements. It is also to be understood that the various exemplary implementations shown in the figures are merely illustrative representations and are not necessarily drawn to scale.

DETAILED DESCRIPTION

Figure 1A:
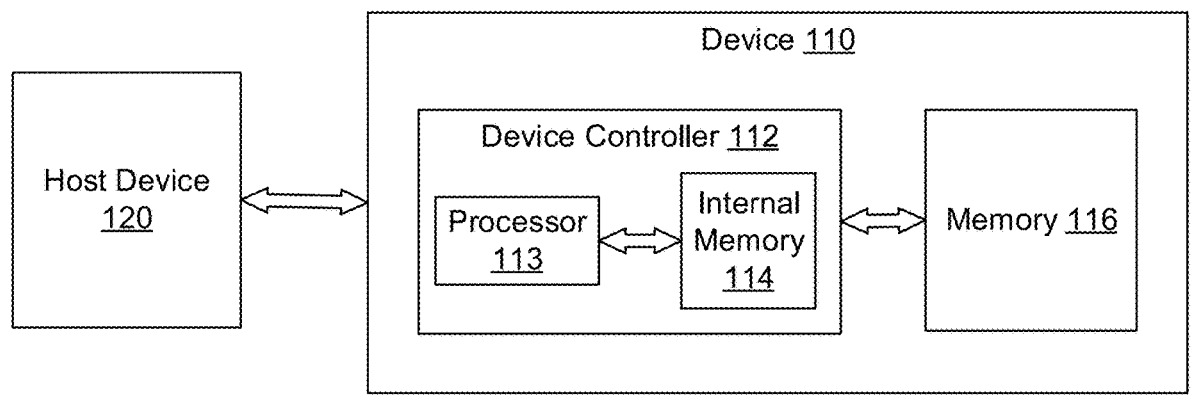
FIG. 1A illustrates an example of a system including a memory device.

FIG. 1A illustrates an example of a system 100 for erasing and/or programming data. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk.

Figure 1B:
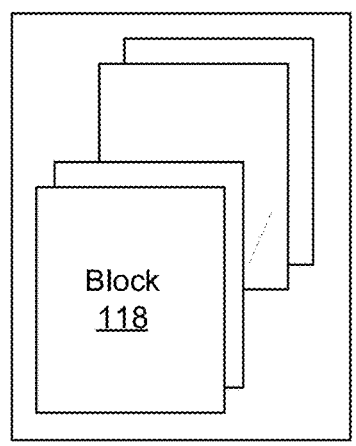
FIG. 1B illustrates an example of a memory including memory blocks.

FIG. 1B illustrates an example configuration of the memory 116 that includes a plurality of blocks 118. The memory 116 can be a two-dimensional (2D) memory or a three-dimensional (3D) memory. The block 118 can be a 2D block or a 3D block.

Figure 1C:
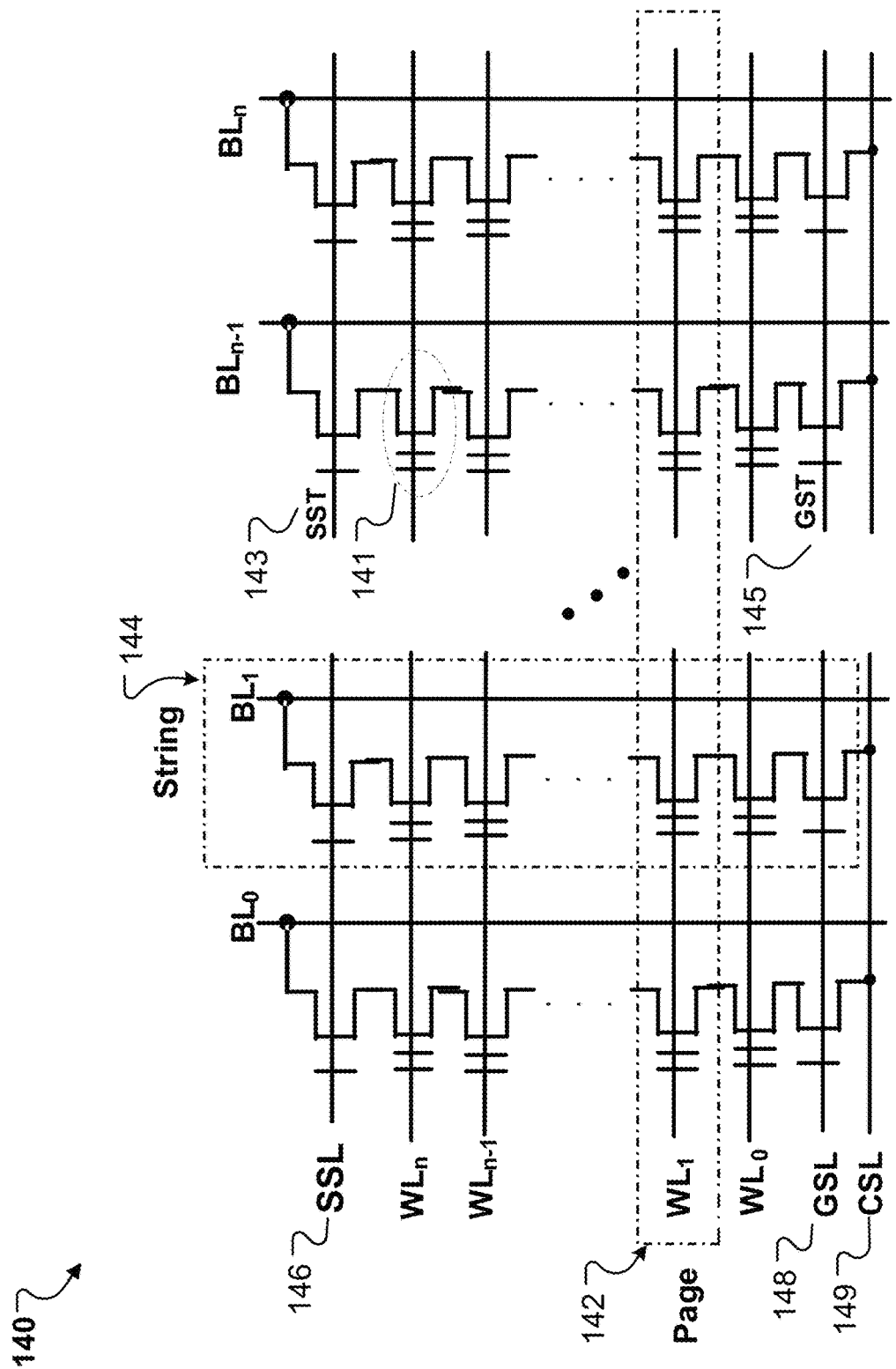
FIG. 1C illustrates an example block of a two-dimensional (2D) memory.

FIG. 1C illustrates an example configuration of a 2D memory block 140 when the memory 116 is a 2D memory. The block 140 can be the block 118. The block 140 includes memory cells 141 coupled in series to column bit lines $BL_0$, $BL_1, \ldots, BL_{n-1}$, and $BL_n$ to form a number of cell strings 144, and to row word lines $WL_0, WL_1, \ldots, WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs in different strings are also connected to the same SSL. Gates of the memory cells 141 are respectively connected to word lines $WL_0, WL_1, \ldots, WL_{n-1}$, $WL_n$. The cell strings 144 or the memory cells 141 are connected to a common source line (CSL) 149 via the GST 145. The CSL 149 can be coupled to a ground. A gate of the GST 145 is connected to a ground select line (GSL) 148. Gates of the GSTs in different strings are also connected to the same GSL.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

The device 110 can include a Flash Translation Layer (FTL) to manage read, write, and erase operations. The FTL can be stored in the device controller 112, e.g., in the internal memory 114. The FTL uses a logical-to-physical (L2P) address mapping table storing mapping from logical pages in a logical block to physical pages in a physical block.

Figure 1D:
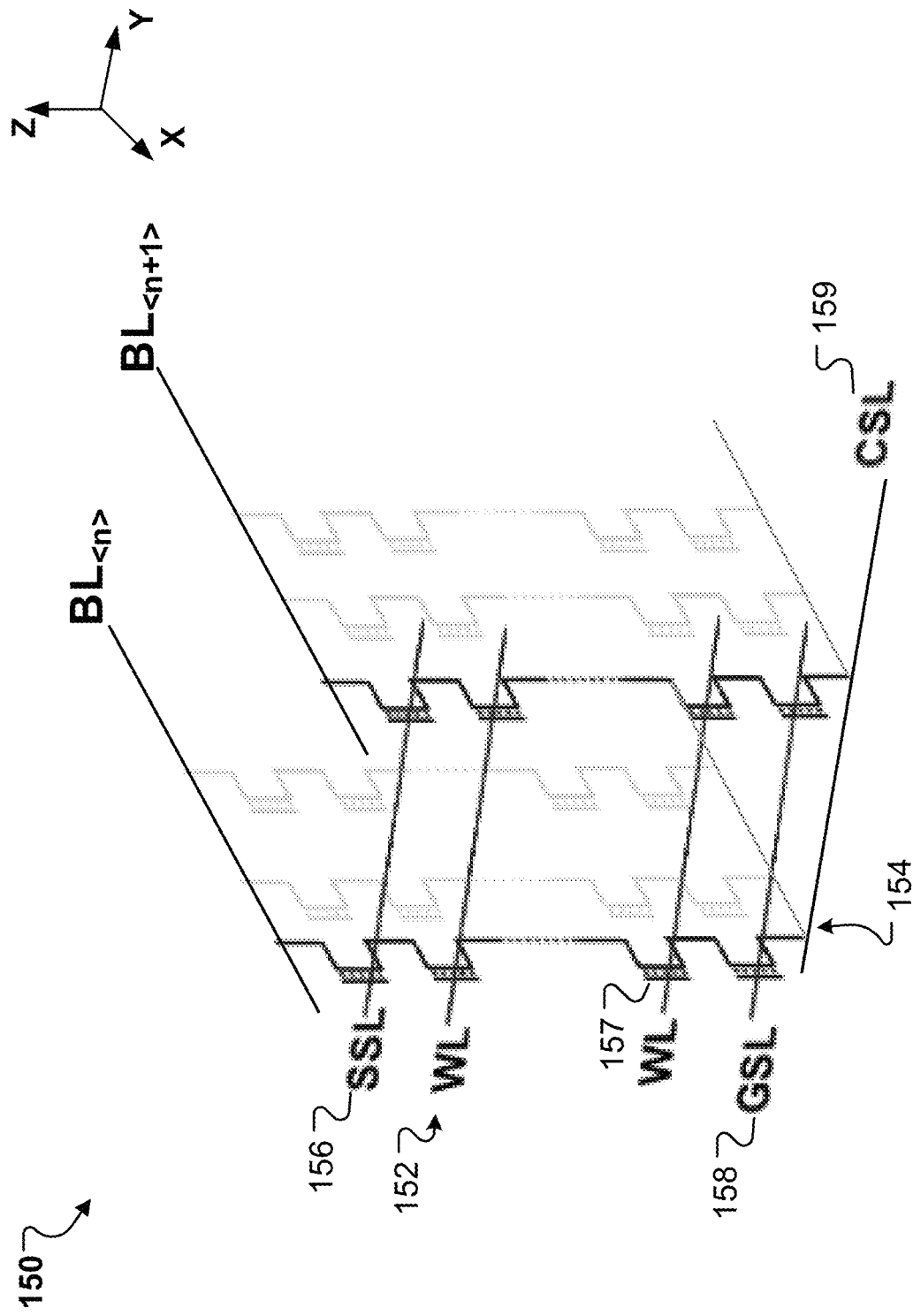
FIG. 1D illustrates an example block of a three-dimensional (3D) memory.

FIG. 1D illustrates an example 3D memory block 150 when the memory 116 is a 3D memory. The memory block 150 can be the block 118. The 3D memory block 150 can be a stack of the 2D memory block 140. Memory cells 157 are arranged in three dimensions, e.g., in an XYZ coordinate system, and coupled to a number of word lines to form a number of cell pages 152 and a number of bit lines to form a number of cell strings 154. A cell page 152 can be a layer, e.g., in the XY plane, and memory cells 157 on the same layer can be coupled to one word line and have a same voltage. A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 of the memory cells 157 are connected to a common source line (CSL) 159 via the GSTs. The CSL 159 can be a conductive layer (or multiple conductive lines) formed on a substrate of the 3D memory. The CSL 159 can be coupled to the ground.

A 3D memory block can be defined between two adjacent CSLs (e.g., along the Z direction). As discussed with further details below, the CSLs can be formed by first forming source line trenches (SLTs) (or openings) in a semiconductor structure and then depositing a conductive material (such as a metallic material) in the SLTs. The adjacent CSLs can be conductively coupled to a common conductive layer (such as the CSL 159) formed on a substrate. The common conductive layer can be made of any one of polysilicon, epitaxial (Epi), or metal. In some cases, the adjacent CSLs and the common conductive layer (such as the CSL 159) together are considered as CSLs.

To increase a density of the 3D memory in a same chip area, a memory cell size can be made smaller and thus a number of memory cells can be increased, e.g., along the X direction and/or along the Y direction. In some cases, more CSLs can be also formed in the array of memory cells to obtain more independent blocks. However, as each CSL has a wide width, e.g., 160 nanometer (nm), the CSLs can occupy a large chip area, which can reduce the number of memory cells in the chip. In some cases, between two adjacent CSLs, instead of using one or more CSLs, one or more SSL cuts can be made to separate a portion (e.g., a block) between the two adjacent CSLs into multiple units (e.g., blocks or sub-blocks). More SSL cuts can generate more units. For example, m SSL cuts can obtain (m+1) units, where m is an integer. As each SSL cut has a smaller width (e.g., less than 80 nm) than a CSL, which can save more space for more memory cells than using CSLs. Moreover, a depth of the SSL cut is shorter than a depth of the CSL that is through the whole semiconductor structure, which can also simplify the manufacture process. Thus, it is desirable to effectively make the SSL cuts between adjacent CSLs so that units separated by the SSL cuts can be independently selected or controlled for memory use.

Figures 5A, 5B, 5C, 5D:
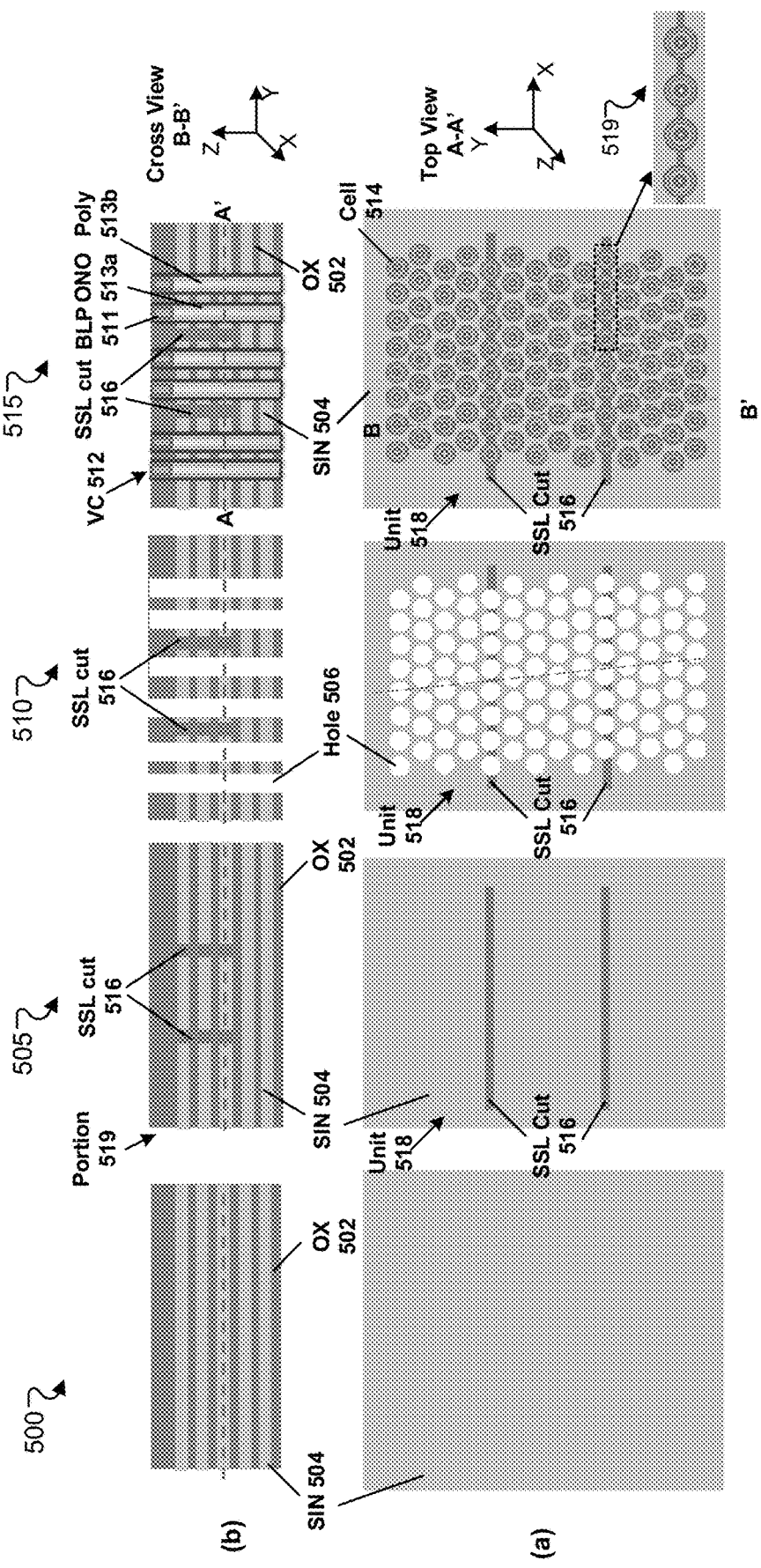
FIGS. 5A-5K illustrate another process of forming multiple SSL cuts between adjacent SSLs in a 3D memory structure.
Figures 5E, 5F, 5G, 5H:
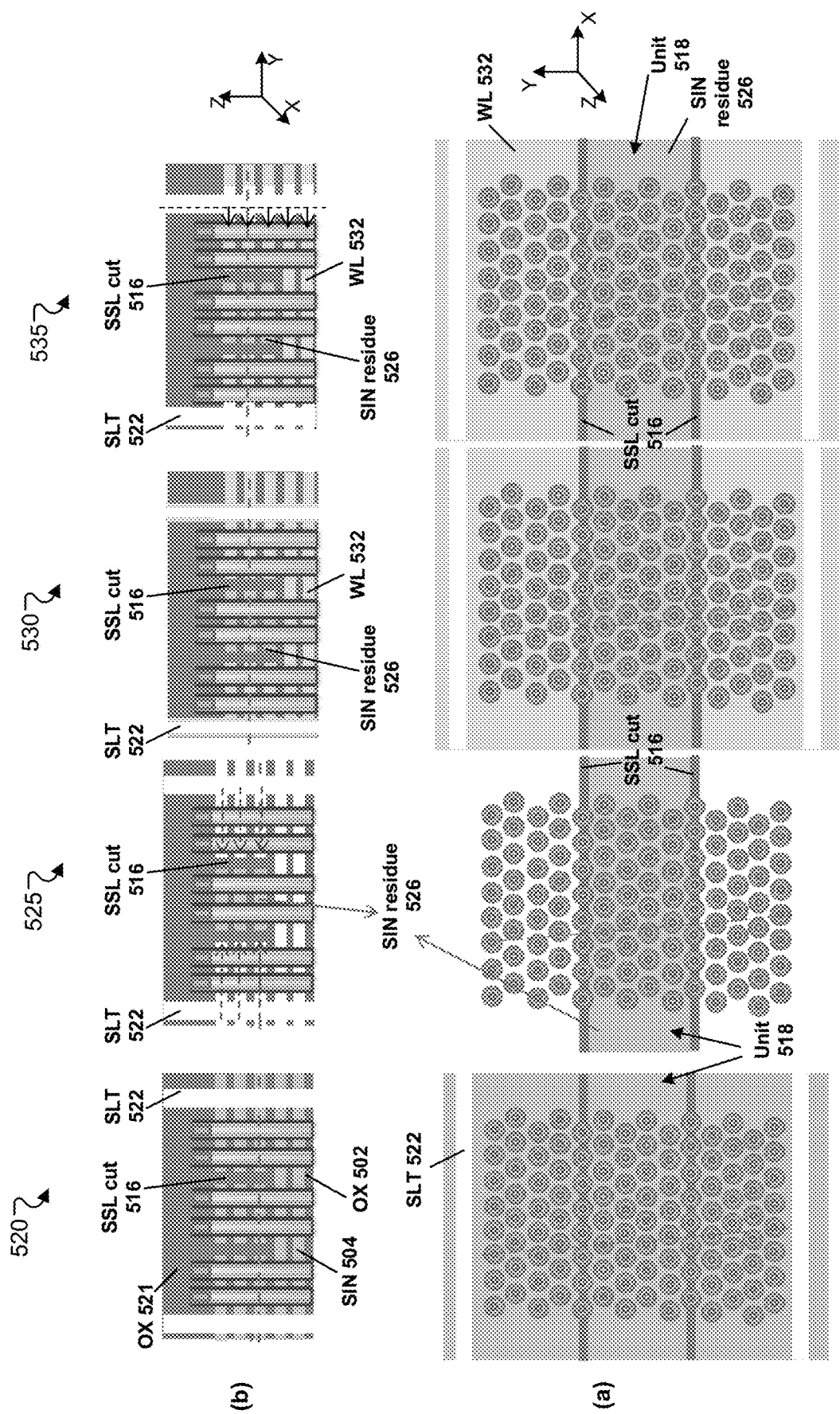
Figures 5I, 5J, 5K:
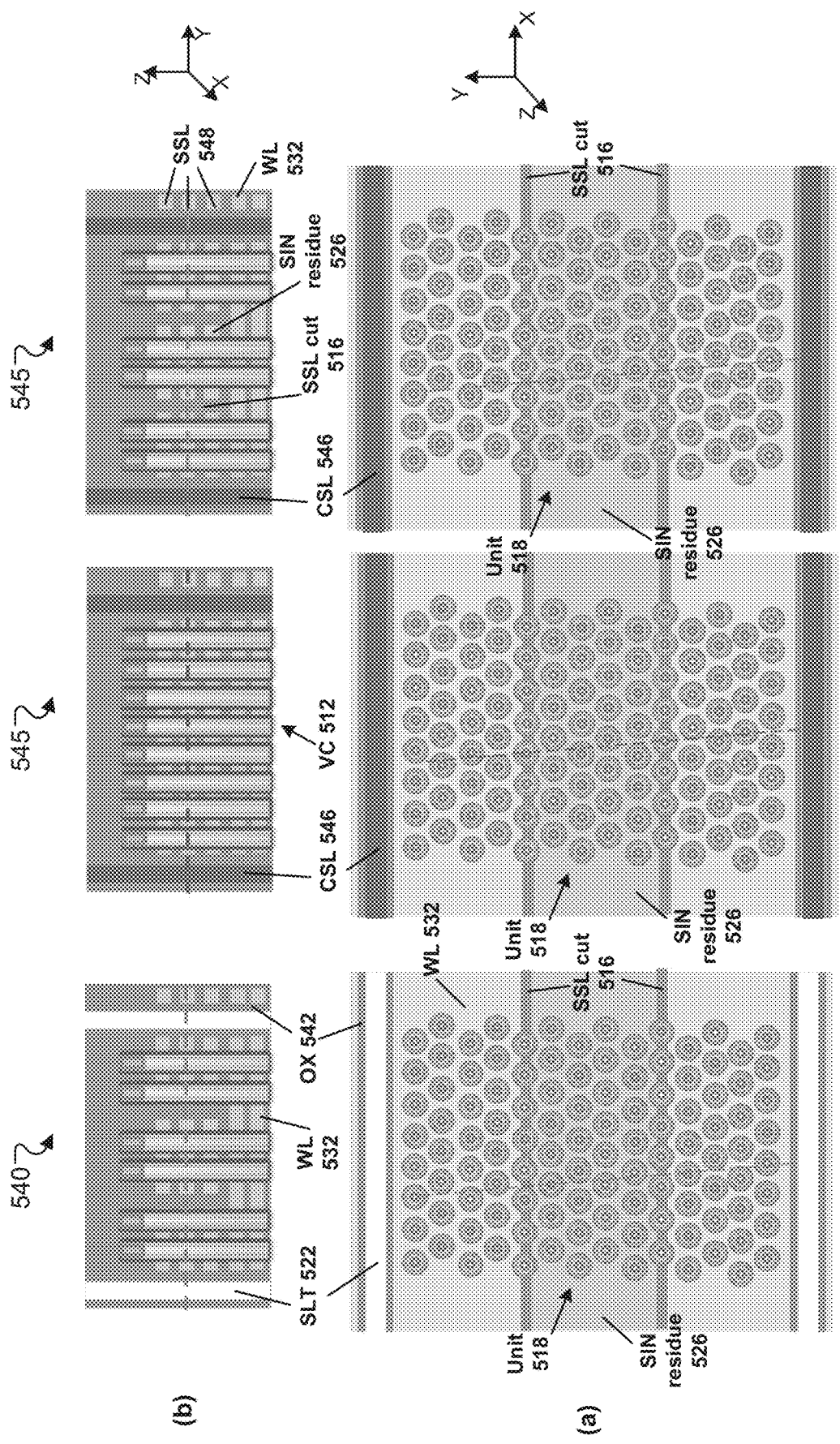

In some implementations, as discussed with further details below, FIGS. 5A-5K illustrate a process of forming SSL cuts between adjacent CSLs before gate replacement or forming word lines, which causes open word line issues due to residue insulating material in the word lines (e.g., as illustrated in FIG. 5K).

Figure 2A:
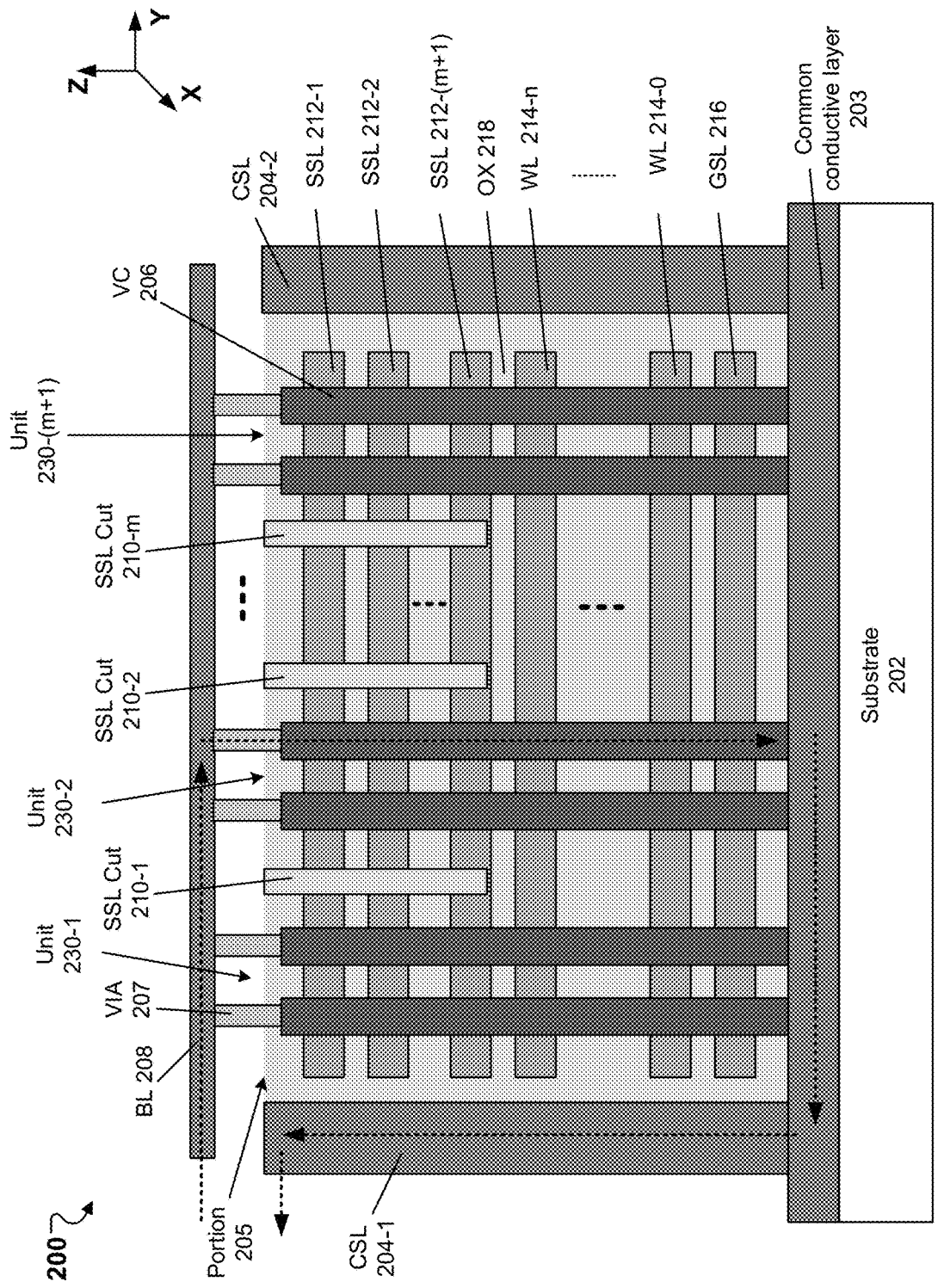
FIGS. 2A-2B illustrate an example 3D memory device with multiple string select line (SSL) cuts.

In some implementations, as discussed with further details below, FIGS. 2A-2B and FIGS. 3A-3N illustrate another process of forming SSL cuts between adjacent CSLs after gate replacement or forming word lines, which can address the above open word line issues to obtain multiple units that can be independently controlled or selected (e.g. as illustrated in FIG. 2A).

FIG. 2A illustrates a cross-sectional view of an example 3D memory device 200. The memory device 200 can be formed by using the process illustrated in FIGS. 3A-3N or FIG. 4 below. The memory device 200 can be implemented as the memory 116 of FIGS. 1A-1B.

The memory device 200 can be formed on a substrate 202. The substrate 202 can include any underlying material or materials upon which a device, a circuit, an epitaxial layer, or a semiconductor may be formed. The substrate 202 can include layers that underlie a semiconductor device or even forms a base layer of a semiconductor device. The substrate can include one or any combination of silicon, doped silicon, germanium, silicon germanium, semiconductor compounds, or other semiconductor materials.

A common conductive layer 203 is formed on the substrate 202. The common conductive layer 203 can be the CSL 159 of FIG. 1D. The common conductive layer 203 can be coupled to the ground. The memory device 200 includes a number of vertical channels (VCs) 206 formed between two adjacent CSLs 204-1, 204-2 (referred to generally as CSLs 204 and individually as CSL 204). The two adjacent CSLs 204 define a portion 205 of the memory device 200. The portion 205 can be a block. Each VC 206 includes a string of memory cells, e.g., the cell string 144 of FIG. 1C or 154 of FIG. 1D, and is coupled to a corresponding bit line (BL) 208 through a corresponding conductive via 207. The VCs 206 and the CSLs 204 are conductively coupled to the common conductive layer 203 on the substrate 202. In some implementations, the common conductive layer 203 includes a number of conducive lines that are conductively coupled to the VCs 206 and the CSLs 204 and isolated by an isolating material.

The VC 206s go through multiple alternating pairs of conductive layers and insulating layers 218 can be made of a dielectric material, e.g., silicon oxide (or simplified as oxide or OX). The conductive layers can be made of a conductive material, e.g., a metal such as Tungsten (W). The conductive layers can form one more SSLs, e.g., SSL 212-1, SSL 212-2, . . . , SSL 212-$m$ (referred to generally as SSLs 212 and individually as SSL 212), one or more word lines (WLs), e.g., WL 214-0, . . . , WL 214-$n$ (referred to generally as WLs 214 and individually as WL 214), and one or more GSLs 216, where m and n are integers. An external surface of the VC 206s acts as gates of the memory cells that are conductively coupled to the conductive layers, e.g., the SSLs 212, the WLs 214, and the GSL 216.

The memory device 200 can include one more SSL cuts, e.g., 210-1, 210-2, . . . , 210-$m$ (referred to generally as SSL cuts 210 and individually as SSL cut 210). The one or more SSL cuts 210 are filled in with an isolating material, e.g., oxide, that can separate the portion 205 of the memory device 200 between two adjacent CSLs 204 into multiple independent units 230-1, 230-2, . . . , 230-($m$+1)(referred to generally as units 230 and individually as unit 230). Each unit 230 can be a new block or a sub-block that can be individually controlled or selected. A width of the SSL cut 210 is smaller than a width of the CSL 204.

As illustrated in FIG. 2A, the SSL cuts 210 are in a top part of the portion 205. A depth of the SSL cuts 210 is shorter than a depth of the VCs 206. The SSL cuts 210 extend along the Z direction through multiple conductive layers and stop at an insulating layer 218. In some implementations, the number of multiple conductive layers that the SSL cuts extend through is m+1, which can be identical to the number of units 230 or larger than the number of SSL cuts by 1. That is, the SSLs 212 can be associated with the one or more SSL cuts 210. Each of the multiple conductive layers is considered as an SSL 212 that can be configured to select a corresponding unit 230 of the number of units 230. For example, as illustrated in FIG. 2A, in a read or write operation, selecting the SSL 212-2 (and not other SSLs like SSL 212-1 or SSL 212-($m$+1)) allows the bit line 208 to select a VC 206 in the unit 230-2. A voltage from the bit line 208 goes into the selected VC 206 and the common conductive layer 203 on the substrate 202 and then into the CSL 204-1 that can be coupled to a periphery of the memory device 200.

Figure 2B:
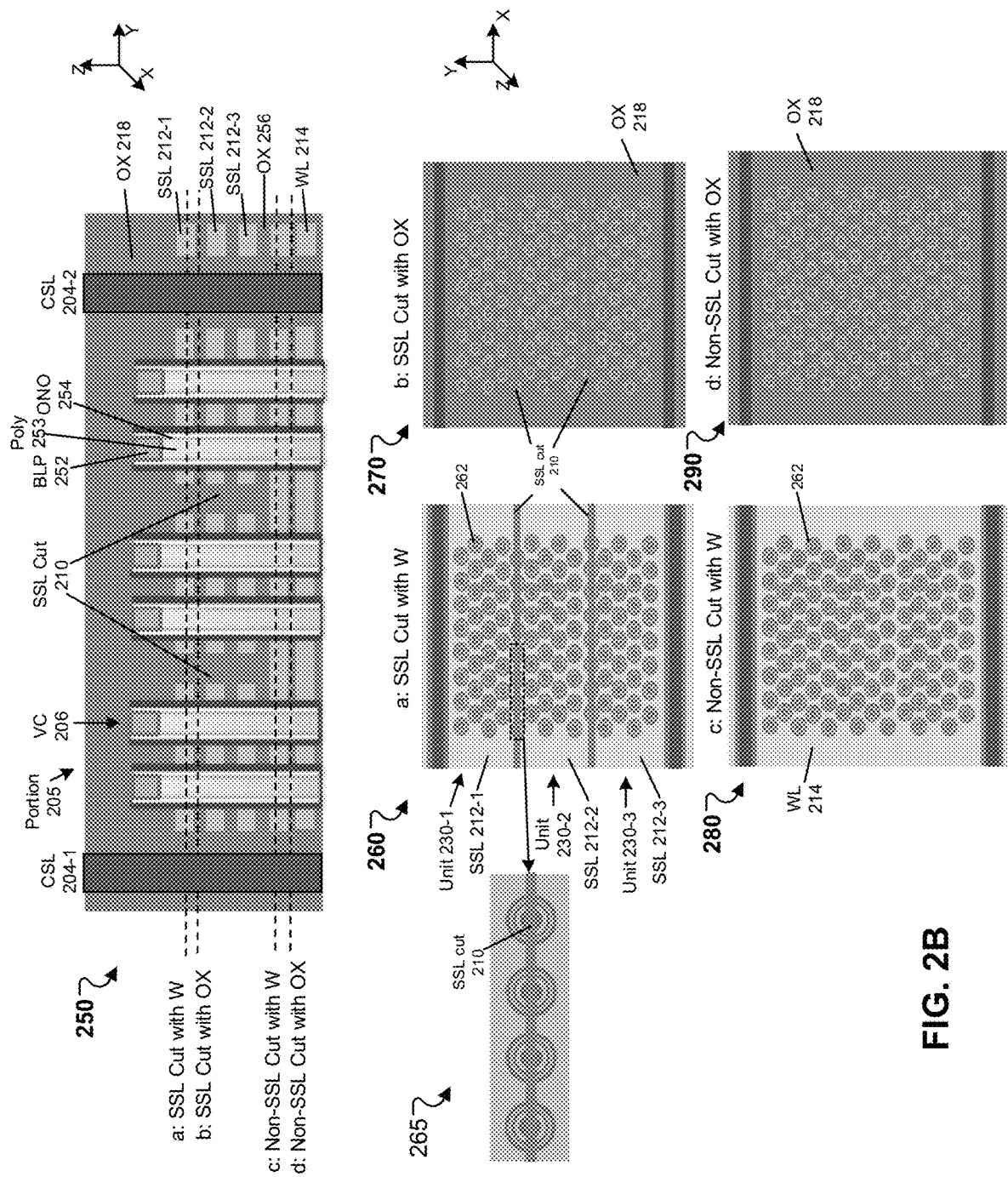

FIG. 2B illustrates a cross-sectional side view 250 (in the YZ plane) of the memory device 200 and four cross-sectional top views 260, 270, 280, 290 (in the XY plane) of the memory device 200 when there are two SSL cuts (m=2). For simplicity, some components of the memory device 200, e.g., the substrate 202 and the common conductive layer 203, are not shown in FIG. 2B.

As the view 250 of FIG. 2B shows, each VC 206 includes a bit line pad (BLP) 252 on a top of the VC 206. The VC 206 can be filled in, e.g., with an oxide/SiN/oxide (ONO) stack 254 and polysilicon (poly) 253. In some embodiments, the VC 206 is filled with any one of an insulator/trapping or trapping/insulator combination. In some embodiments, the VC 206 is filled with any one of a poly only or poly/insulator combination. The BLP 252 is conductive and configured to be coupled to the conductive VIA 207 that is coupled to the bit line 208. The BLP 252 is also configured to seal the VC 206 such that the interior of the VC 206 is separated from an external environment during processing, e.g., as illustrated in FIGS. 3D-3N.

As illustrated in FIG. 2B, between the two adjacent CSLs 204, two SSL cuts 210 separates a top part of the portion 205 into three units 230-1, 230-2, 230-3. Each of the units 230-1, 230-2, 230-3 can be independently selectable by a corresponding SSL 212-1, 212-2, 212-3. Each SSL cut 210 extends through the three conductive layers (e.g., SSLs 212) and stops at a bottom insulating layer OX 256. The conductive layers can be made of metal, e.g., Tungsten (W).

The view 260 shows a cross-sectional top view along a plane including the SSL cuts 210 and a conductive layer (or SSL 212 made of W) above the bottom insulating layer 256. The view 270 shows a cross-sectional top view along a plane including the SSL cuts 210 and an insulating layer (e.g., an OX layer) above the bottom insulating layer 256. The view 280 shows a cross-sectional top view along a plane including a conductive layer (or WL 214 made of W) below the bottom insulating layer 256 without the SSL cuts 210. The view 290 shows a cross-sectional top view along a plane including an insulating layer (e.g., an OX layer) below the bottom insulating layer 256 without the SSL cuts 210. The VCs on the plane are insulated from each other by the insulating material, e.g., OX.

As shown in the view 280, without the SSL cuts 210, memory cells 262 on a plane can be all conductively connected together by the WL 214, e.g., at a same voltage. However, a number of memory cells 262 between two adjacent CSLs 204 along a direction (e.g., 14 memory cells along the Y direction in the view 280) can be much larger than a number of memory cells for a block along the same direction (e.g., 4 memory cells). Thus, it is beneficial to make one or more SSL cuts to separate the memory cells into different units (e.g., blocks or sub-blocks) that can be separately controlled or selected. In some examples, the number of memory cells of a block is 4. If the number of memory cells between two adjacent CSLs 204 is more than 4 but no more than 9, one SSL cut can be made to separate the memory cells into 2 units with one memory cells being dummy. If the number of memory cells between two adjacent CSLs 204 is more than 9 but no more than 14, two SSL cuts can be made to separate the memory cells into 3 units with two memory cells being dummy.

As shown in the view 260, the number of memory cells 262 between two adjacent CSLs 204 is 14, and two SSL cuts 210 separate the memory cells into three units 230-1, 230-2, 230-3. Note that, in each unit 230, memory cells 262 on the corresponding SSL 212 are conductively coupled together. Each unit 230 can be selected or controlled by a corresponding SSL 212.

The two SSL cuts 210 may occupy two lines of memory cells, e.g., along the X direction, that become dummy lines of memory cells. As illustrated in an enlarged view 265 shows (e.g., also illustrated with further details below in FIGS. 3M-3N), each SSL cut 210 can be on top of the memory cells 262 of the VCs 206 along the vertical direction (e.g., the Z direction). A top of the VCs 206 covered by the SSL cut 210 is filled with an insulating material, e.g., OX, which is same as the insulating material filled in the SSL cut 210. A width of the SSL cut 210 (e.g., along the Y direction) can be smaller than a size (e.g., a diameter) of the VC 206, so that each SSL cut 210 covers less than one line of VCs 206 that becomes a dummy line of VCs. In some examples, the width of the SSL cut 210 is in a range of about 50 nm to about 80 nm, and the diameter of the VC 206 is about 125 to 135 nm.

Figures 3A, 3B, 3C:
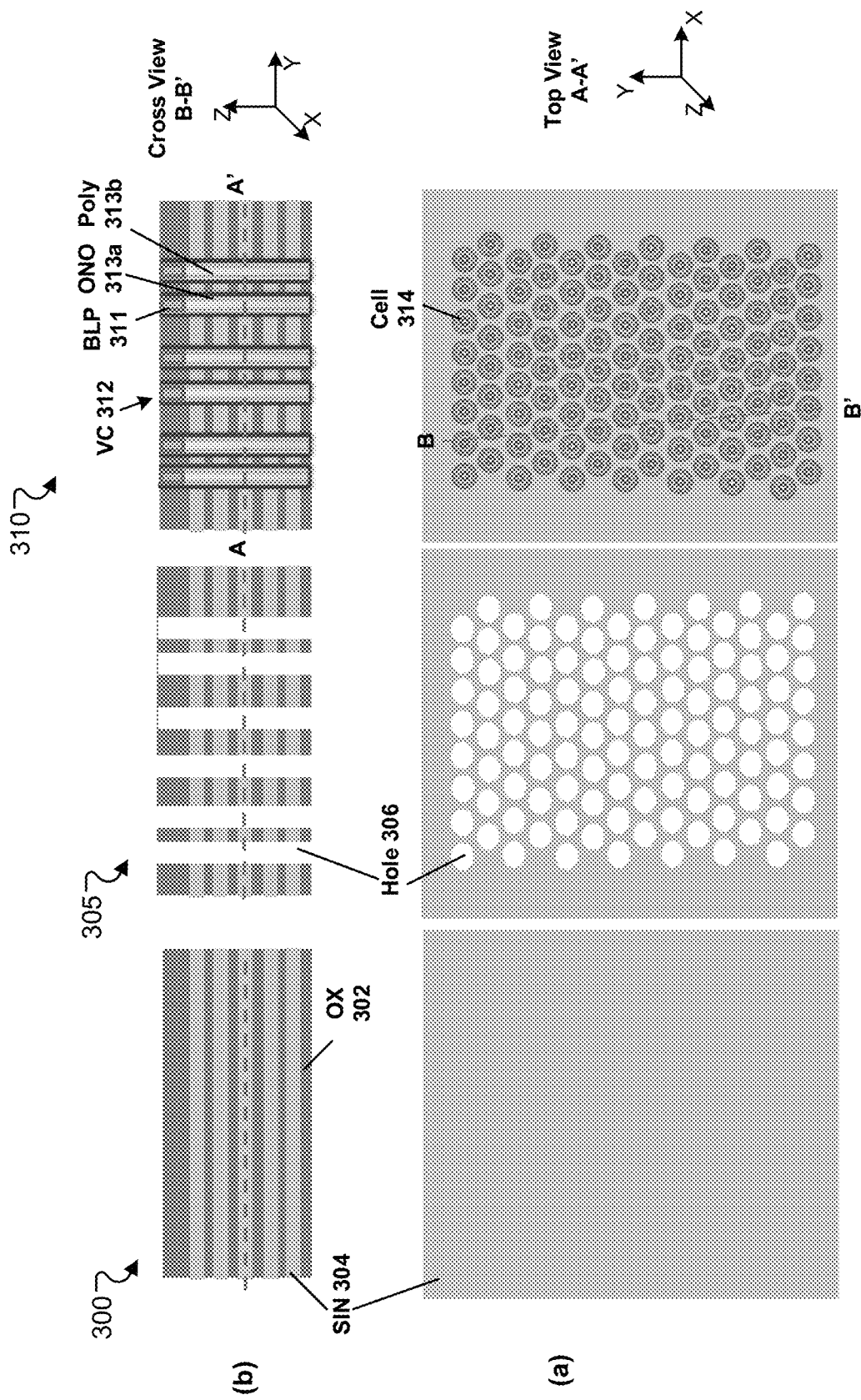
FIGS. 3A-3N illustrate a process of forming multiple SSL cuts between adjacent common source lines (CSLs) in a 3D memory structure.
Figures 3H, 3I, 3J, 3K:
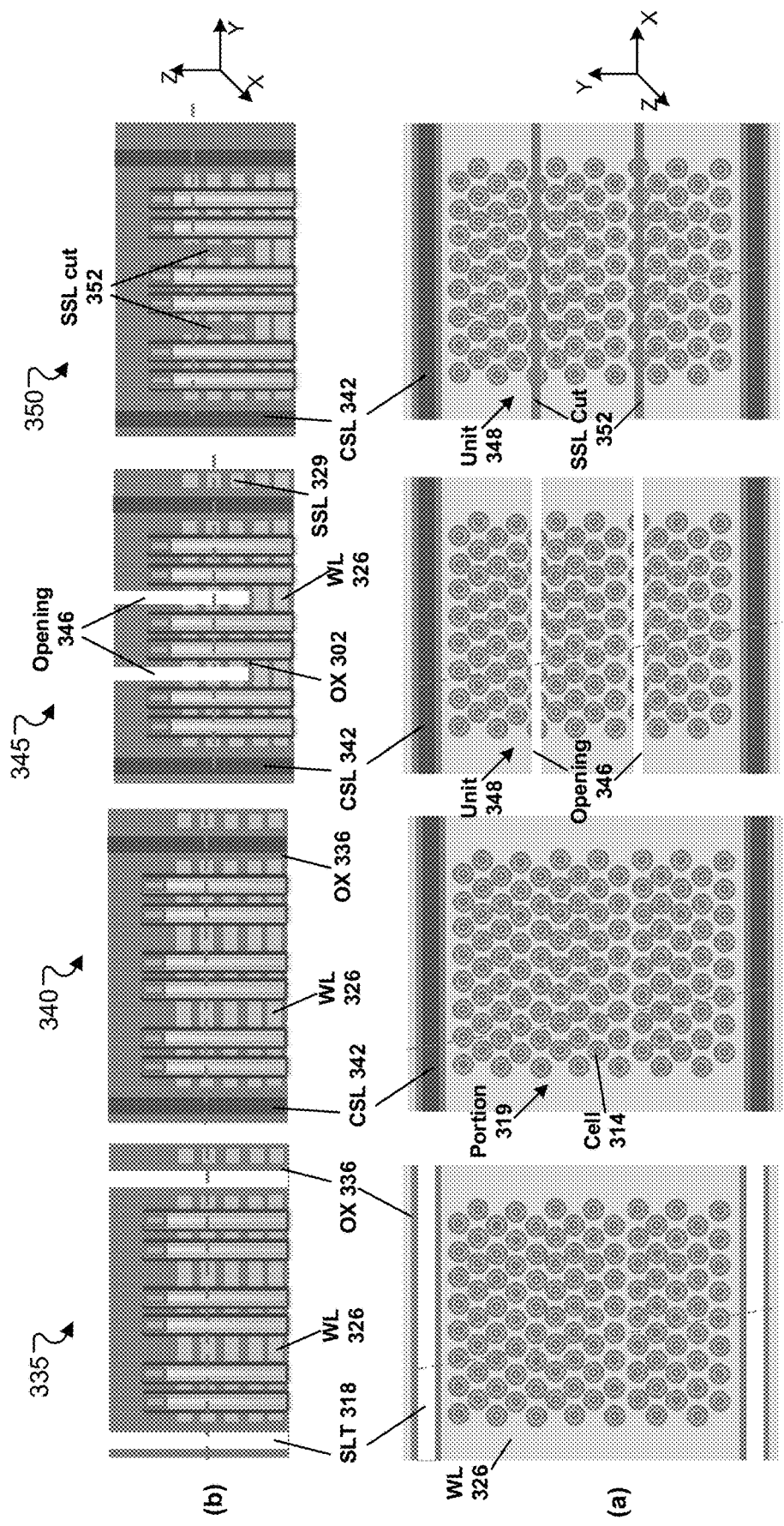
Figures 3L, 3M, 3N:
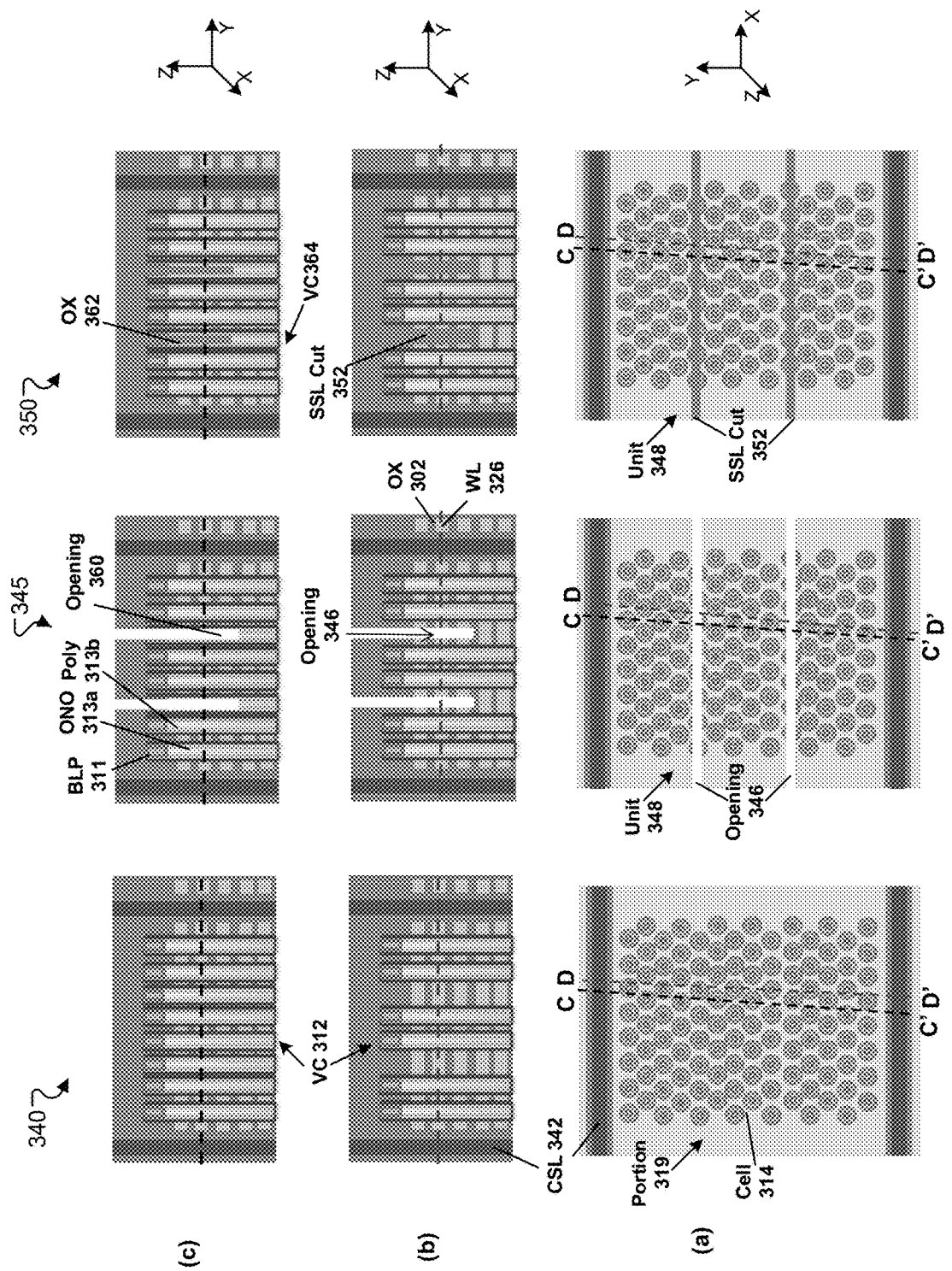

FIGS. 3A-3N illustrate a process of forming multiple string select line (SSL) cuts between adjacent common source lines (CSLs) in a semiconductor device, such as a 3D memory structure. The process can be used to form the 3D memory device 200 of FIGS. 2A-2B. For simplicity, a substrate for the semiconductor device is not shown in the figures. Each of FIGS. 3A-3K includes a bottom diagram (a) and a top diagram (b), where the top diagram (b) shows a cross view B-B' shown in the bottom diagram (a) and the bottom diagram (a) shows a top view A-A' shown in the top diagram (b).

FIG. 3A shows a structure 300 formed on the substrate. The structure 300 includes a plurality of alternating pairs of two different insulating layers, e.g., OX 302/SIN 304. A top layer and a bottom layer of the structure 300 are both oxide layer 302. The alternating pairs of two different insulating layers OX 302 and SIN 304 can be deposited on the substrate by Metal-Organic Chemical Vapor Deposition (MOCVD), molecular beam epitaxy (MBE), atomic layer deposition (ALD), physical vapor deposition (PVD), Chemical Vapor Deposition (CVD), or any other suitable deposition methods in a vacuum chamber with a certain temperature.

FIG. 3B shows a structure 305 after forming a plurality of vertical holes (or openings) 306 through the structure 300, e.g., the multiple layers OX 302 and SIN 304. The holes 306 can be formed in a matrix or an array. The holes 306 can be formed by anisotropic etching along the vertical direction such as the Z direction, e.g., using reactive ion etching (RIE) or plasma etching.

FIG. 3C shows a structure 310 after forming vertical channels (VC) 312 by filling in the holes 306. The holes 306 can be filled with any one of an insulator/trapping or trapping/insulator combination, or any one of a poly only or poly/insulator combination. The VC 312 can be the VC 206 of FIGS. 2A-2B. In some examples, the VCs 312 includes multiple layers OX/SIN/OX (ONO) 313a. The ONO 313a can be formed on an internal surface of the hole 306, and polysilicon 313b can be filled in a middle of the hole 306. The filled materials (e.g., ONO 313a and polysilicon 313b) in each VC 312 can form a string of memory cells 314 along the vertical direction such as the Z direction. A bit line pad (BLP) 311 can be formed on a top of the VC 312 to seal the VC 312 such that the interior of the VC 312 is separated from an external environment during the following processing steps. The BLP 311 can be the BLP 252 of FIG. 2B. The BLP 311 is conductive and can be coupled to a bit line, e.g., the bit line 208 of FIG. 2A through a conductive VIA, e.g., the VIA 207 of FIG. 2A.

As illustrated in FIG. 3D, an insulating layer 316, e.g., OX, is formed on top of the VCs 312, which can be configured to protect the BLP 311 from the following processing steps and to keep conductive. Then, source line trenches (SLTs) 318 are formed in a structure 315, e.g., by anisotropic etching along the vertical direction such as the Z direction. The SLTs 318 also extend along the X direction. The SLT 318 has a width along the Y direction, e.g., 160 nm. The SLTs 318 separate the plurality of VCs 312 into multiple portions 319. Two adjacent SLTs 318 define a corresponding portion 319. As illustrated in FIG. 3D, along the Y direction, the portion 319 can include 14 memory cells 314.

FIG. 3E shows a structure 320 after one type of the insulating layers, e.g., SIN 304, is removed from the structure 315. The SIN insulating material of the SIN layers 304 can be selectively etched away, e.g., using wet etching with an etching solution such as $H_3PO_4$, and the other type of insulating layers OX 302 and the VCs 312 remain. The etching solution flows via the SLTs 318 towards the SIN layer 304, as the arrow line shows. As there is no isolation in the portion 319, all the SIN insulating material, for example, can be completely, removed.

FIG. 3F shows a structure 325 after depositing, e.g., using CVD, a conductive material (e.g., a metal W) to fill a space left between the insulating layers OX 302. The conductive material forms a conductive layer 326 between the insulating layers 302. The conductive material can form a gate for the memory cell 314. The conductive layer 326 can form a word line connecting to the gates of the memory cells 314. This step can be also be referred to as gate replacement, e.g., replacing the insulating layer 304 with the conductive layer 326.

The conductive material can also be formed on an internal surface of the SLT 318, which may make a width of the SLT 318 smaller. To insulate the conductive layers (or the word lines) 326 from a common source line (CSL) to be formed in the SLT 318, as illustrated in FIG. 3G, the conductive material (e.g., W) around the SLT 318 is etched, e.g., by wet etching. The etching solution can flow through the SLT 318 towards the conductive material, e.g., as the arrow lines show. In a formed structure 330, a gap within the isolating layer OX 316 can be narrower than a gap below the isolating layer OX 316.

After the conductive material around the SLT 318 is etched away, an insulating material, e.g., OX, is deposited around the SLT 318. As illustrated in a structure 335 of FIG. 3H, a thin insulating layer 336 separates the SLT 318 from the conductive layers 326. In some cases, if there is too much insulating material deposited in the SLT 318, the extra insulating material can be removed, e.g., by etching, such that the SLT 318 can have a suitable width while still being isolated from the conductive layers 326.

FIG. 3I shows a structure 340 after forming common source lines (CSLs) 342 in the SLTs 318 by depositing (e.g., CVD) a conductive material in the SLTs 318. The conductive material can be polysilicon, epitaxial (Epi), or metal like W. In some cases, a surface of the structure 340 is smoothed or polished, e.g., using chemical mechanical polishing (CMP) or planarization. The CSLs 342 can be the CSLs 204 of FIGS. 2A-2B. The CSL 342 is isolated from the conductive layers (or word lines) 326 by the insulating layers 336. Between two adjacent CSLs 342, the portion 319 includes a number of memory cells 314, which can be separated into multiple units by one or more SSL cuts.

FIG. 3J shows a structure 345 after forming two openings 346 for SSL cuts in a top part of the portion 319 between two adjacent CSLs 342, e.g., by etching. The etching can be implemented by using CF4 gas based etching. The two openings 346 separates the portion 319 into three units 348. The unit 348 can be the unit 230 of FIGS. 2A-2B. Each unit 348 can be a new block or a sub-block. Each unit 348 can include 4 memory cells along the Y direction. The top part can include three WLs 326 separated by the insulating layers OX 302. The openings 346 extend through the three WLs 326 but not beyond a bottom insulating layer OX 302 under the three WLs 326. The three WLs 326 become three corresponding SSLs 329. Each SSL 329 can be configured to select a corresponding unit 348.

FIG. 3K shows a structure 350 after forming SSL cuts 352 by depositing, e.g., CVD, an insulating material (e.g., OX) into the openings 346. In some cases, a surface of the structure 350 is smoothed or polished, e.g., using CMP. The SSL cut 352 can be the SSL cut 210 of FIGS. 2A-2B. The structure 350 can be illustrated by the views 250, 260, 270, 280, 290 of FIG. 2B. The SSL cut 352 has a width, e.g., less than 100 nm, that is smaller than a width of the CSLs 342, e.g., 160 nm. Each SSL cut 352 separates two adjacent units 348. Each unit 348 can be selectable by a corresponding SSL 329.

To better illustrate the structures 340, 345, 350, FIGS. 3L-3N show cross views CC' and DD', where CC' plane crosses VCs 312 covered by the SSL cuts 352, and DD' plane does not cross VCs 312 but regions between the VCs 312 that are covered by the SSL cuts 352. Each of FIGS. 3L-3N includes three diagrams: (a) shows the cross view of AA' plane, (b) shows the cross view of DD' plane, and (c) shows the top view of CC' plane.

Diagrams (a) and (b) of FIGS. 3L, 3M, 3N are similar to the bottom diagram (a) and the top diagram (b) of FIGS. 3I, 3J, 3K, respectively. As diagrams (c) of FIGS. 3L, 3M, 3N show, top parts of VCs 312 are etched to form the openings 360 that are then filled with the insulating material 362 to form portions of the SSL cuts 352, while top parts without VCs 312 are etched to form the openings 346 then filled with the insulating material 362 to form other portions of the SSL cuts 352. The top parts of the VCs 312 include the BLP 311, the ONO 313a, and the polysilicon 313b. The top parts without the VCs 312 include multiple layers of conductive layers WL 326 (e.g., made of metal W) and insulating layers 302 (e.g., made of OX). Non-selective etching, e.g., CF4 gas based etching, can be used to remove different materials OX, SIN, W, polysilicon at the same time. The VCs 312 with the openings 360 filled with the insulating material 362 (e.g., OX) become VCs 364, as illustrated in diagram (c) of FIG. 3N. In contrast, the openings 346 without the VCs 312 are filled with the insulating material 362 (e.g., OX) to obtain the SSL cuts 352. Thus, as illustrated in the view 265 of FIG. 2B, the SSL cuts 352 can cross one or more VCs 364 having the insulating material in their top parts. The SSL cuts 352 are continuous layers (or walls), e.g., in the ZX plane.

In some implementations, as the SSL cuts 352 are made within the portion 319, the SSL cuts 352 can be formed after the SLTs 318 and the word lines 326 are formed (e.g., as illustrated in FIG. 3F), but before the CSLs 342 are formed.

Figure 4:
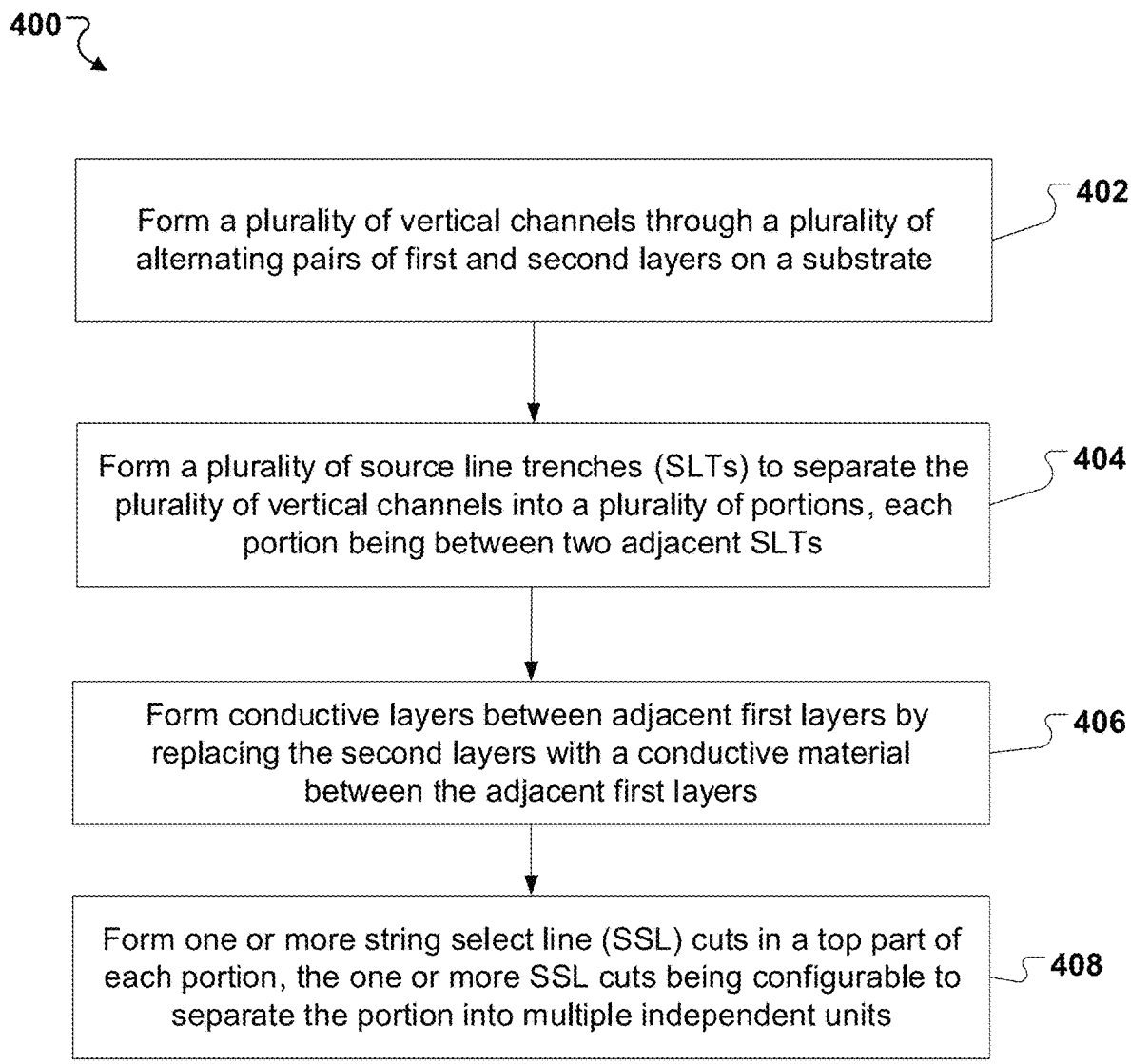
FIG. 4 is a flow chart of a process of forming a 3D memory device with one or more SSL cuts.

FIG. 4 is a flow chart of a process 400 of forming a semiconductor device with one or more SSL cuts. The process 400 can be similar to the process illustrated in FIGS. 3A to 3N. The semiconductor device can be the memory 116 of FIGS. 1A-1B, the memory device 200 of FIGS. 2A-2B, or the structure 350 of FIGS. 3K and 3N.

The semiconductor device can be formed on a substrate, e.g., the substrate 202 of FIG. 2A. A plurality of alternating pairs of first and second layers can be first formed on the substrate, e.g., as illustrated in FIG. 3A. The first layers are electrically insulating, e.g., the OX layer 302 of FIG. 3A. The second layers can be also electrically insulating, e.g., the SIN layer 304 of FIG. 3A.

At step 402, a plurality of vertical channels (VCs) is formed through the plurality of alternating pairs of the first and second layers on the substrate. The VCs can be the VC 312 of FIG. 3C. The plurality of VCs can be formed according to FIGS. 3B and 3C. First, a plurality of holes, e.g., the holes 306, is formed by vertically etching through the plurality of alternating pairs of the first and second layers, e.g., by using RIE or plasma etching. Second, multiple transistor layers, e.g., the ONO 313a and the polysilicon 313b of FIG. 3C, can be formed in the holes to form strings of memory cells, e.g., the cell strings 154 of FIG. 1D. For example, a stack of oxide/SIN/oxide (ONO), e.g., the ONO 313a of FIG. 3C, can be first formed on internal surfaces of the holes and then polysilicon, e.g., the polysilicon 313b of FIG. 3C, can be filled in the holes. Third, conductive bit line pads (BLPs), e.g., the BLPs 311 of FIG. 3C can be formed on top of the strings of memory cells in the holes to form the VCs.

At 404, a plurality of source line trenches (SLTs) is formed to separate the plurality of vertical channels into a plurality of portions. Each portion of the plurality of portions is between two adjacent SLTs. The SLTs can be the SLTs 318 of FIG. 3D. The portions can be the portions 319 of FIG. 3D.

At 406, conductive layers between adjacent first layers in each portion of the plurality of portions are formed by replacing the second layers with a conductive material between the adjacent first layers. The second layers, e.g., SIN, can be selectively etched, e.g., by wet etching using an etching solution $H_3PO_4$. The etching solution can flow towards the second layers through the SLTs to etch the second layers to thereby form spacings between the adjacent first layers, as illustrated in FIG. 3E. Then, the conductive material, e.g., metal W, is deposited to fill the spacings between the adjacent first layers to form the conductive layers, e.g., as illustrated in FIG. 3F. The conductive layers can form word lines, e.g., the word lines 326 of FIG. 3F.

At 408, one or more string select line (SSL) cuts in a top part of each portion are formed. The one or more SSL cuts, e.g., the SSL cuts 210 of FIGS. 2A-2B or the SSL cuts 352 of FIGS. 3K and 3N, are configurable to separate the portion, e.g., the portion 319 of FIG. 3I, into multiple independent units, e.g., the units 230 of FIGS. 2A-2B or the units 348 of FIGS. 3K and 3N.

The one or more SSL cuts can be formed according to FIGS. 3J, 3M, 3K, and 3N. First, the top part of the portion is etched to form one or more openings corresponding to the one or more SSL cuts, as illustrated in FIG. 3J. In some cases, a top part of one or more vertical channels corresponding to the one or more SSL cuts is also etched, e.g., as illustrated in FIG. 3M. The top part of the one or more vertical channels corresponds to the top part of the portion. Different materials in the top part of the VCs and in the top part of the portion without the VCs, e.g., OX, SIN, W, Polysilicon, are etched away together, e.g., using CF4 gas etching. Second, an insulating material, e.g., OX, is filled into the one or more openings to form the one or more SSL cuts, as illustrated in FIG. 3K. Accordingly, the insulating material is also filled into the top part of the one or more vertical channels, e.g., as illustrated in diagram (c) of FIG. 3N.

Each SSL cut can extend to a depth of the top part of the portion but not beyond a bottom first layer, e.g., the OX layer 256 of FIG. 2B, in the top part. The SSL cut is orthogonally through one or more conductive layers of the conductive layers above the bottom first layer. Each of the one or more conductive layers forms a respective SSL of multiple SSLs, e.g., the SSL 212 of FIGS. 2A-2B, and configured to select a corresponding unit of the multiple independent units. A number of the multiple SSLs is identical to a number of the multiple independent units.

As the view 260 of FIG. 2B shows, the SSL cuts are formed to separate memory cells in the one or more conductive layers above the bottom first layer into the multiple independent units. As the view 280 of FIG. 2B shows, memory cells in a conductive layer (e.g., a word line) below the bottom first layer are conductively connected without separation by the SSL cuts. As the view 265 of FIG. 2B shows, each SSL cut extends continuously along a direction without separation by one or more vertical channels along the direction in the portion. The insulating material of the SSL cut occupies top parts of the one or more vertical channels along the direction in the portion.

The process 400 can further include forming a plurality of common source lines (CSLs) in the plurality of SLTs. For example, the CSLs can be formed according to FIGS. 3G to 3I. First, after the conductive layers are formed, the conductive material around the plurality of SLTs is etched away, as illustrated in FIG. 3G. Second, an insulating material is deposited into the interior areas of the plurality of SLTs, as illustrated in FIG. 3H. Third, the conductive material is deposited in the SLTs to form the plurality of CSLs, and the insulating material, e.g., the OX layer 336 of FIG. 3I, is configured to isolate the CSLs from the conductive layers.

In some implementations, as illustrated in FIGS. 3G-3N, the CSLs are formed before the one or more SSL cuts are formed. After forming the plurality of CSLs, the one or more SSL cuts in the top part of each portion between two corresponding adjacent CSLs are formed, and each SSL cut is configurable to separate two adjacent independent units in the portion. In some implementations, the CSLs are formed after the one or more SSL cuts are formed at 408.

For comparison with the process described in FIGS. 3A-3N and the process 400 of FIG. 4, FIGS. 5A-5K illustrate another process of forming multiple string select line (SSL) cuts between adjacent common source lines (SSLs) in a 3D memory structure. The process forms the SSL cuts before forming word lines and before forming CSLs, which causes issues including open word lines and inoperable units.

For simplicity, a substrate for the semiconductor device is not shown in the figures. Each of FIGS. 5A-5K includes a bottom diagram (a) and a top diagram (b), where the top diagram (b) shows a cross view B-B' shown in the bottom diagram (a) and the bottom diagram (a) shows a top view A-A' shown in the top diagram (b).

FIG. 5A shows a structure 500 formed on the substrate. The structure 500 can be the structure 300 of FIG. 3A. The structure 500 includes a plurality of alternating pairs of two different insulating layers, e.g., OX 502/SIN 504. A top layer and a bottom layer of the structure 500 are both oxide layer 502.

Different from the process in FIGS. 3D to 3N, the process here forms one or more SSL cuts after forming the structure 500 but before forming word lines and before forming CSLs. For example, FIG. 5B shows a structure 505 after two SSL cuts 516 are formed in a top part of a portion 519 of the structure 500. The SSL cuts 516 can be formed by first etching (e.g., RIE) the top part to form two openings and then filling an insulating material (e.g., OX) into the openings. The SSL cuts 516 are similar to the SSL cuts 352 of FIG. 3K. The SSL cuts 516 separate the portion 519 into three units 518. Each SSL cut 516 extends through three SIN layers 504 and not beyond a bottom OX layer 502 in the top part of the portion 519.

FIG. 5C shows a structure 510 after forming a plurality of vertical holes (or openings) 506 through the structure 505. The holes 506 can be the holes 306 of FIG. 3B. The holes 306 can be formed by anisotropic etching along the vertical direction such as the Z direction, e.g., using reactive ion etching (RIE) or plasma etching. Different from the structure 305 of FIG. 3B, the structure 510 includes the SSL cuts 516. As the SSL cuts 516 are formed before forming the holes 506, the holes 506 may be formed on the SSL cuts 516.

FIG. 5D shows a structure 515 after forming vertical channels (VC) 512 by filling in the holes 506. The VC 512 can be the VC 312 of FIG. 3C. In some examples, the VCs 512 includes multiple layers OX/SIN/OX (ONO) 513a, e.g., the ONO 313a of FIG. 3C, and polysilicon 513b, e.g., the polysilicon 313b of FIG. 3C. The filled materials (e.g., ONO 513a and polysilicon 513b) in each VC 512 can form a string of memory cells 514 along the vertical direction such as the Z direction. A bit line pad (BLP) 511, e.g., the BLP 311 of FIG. 3C, can be formed on a top of the VC 512. Different from the structure 310 of FIG. 3C, the structure 515 includes the SSL cuts 516. As the SSL cuts 516 are formed before forming the holes 506 and then the VCs 512, as shown by a view 519, the SSL cuts 516 do not cross the VCs 512, which is different from the SSL cuts 352 crossing the VCs 312 as illustrated in FIG. 3K or 3N when the SSL cuts 352 are formed after forming the word lines 326 or after gate replacement.

As illustrated in FIG. 5E, an insulating layer 521, e.g., OX, is formed on top of the VCs 512, which can be configured to protect the BLP 511 from the following processing steps and to keep conductive. Then, source line trenches (SLTs) 522 are formed in a structure 520, e.g., by anisotropic etching along the vertical direction such as the Z direction. The SLTs 522 separate the plurality of VCs 512 into multiple portions 519. Two adjacent SLTs 522 define the corresponding portion 519 that is separated into three units 518.

FIG. 5F shows a structure 525 after one type of the insulating layers, e.g., SIN 504, is removed from the structure 520. The SIN insulating material of the SIN layers 504 can be selectively etched away, e.g., using wet etching with an etching solution such as $H_3PO_4$. The etching solution flows via the SLTs 522 towards the SIN layer 504, as the arrow line shows.

However, as the SSL cuts 516 (e.g., made of oxide material different from SIN 504) isolate a middle unit 518 from adjacent top and bottom units 518, the middle unit 518 is not etched by the etching solution, and thus there is an insulating material, e.g., SIN residue 526, remaining in the SSL cuts 516. According, the structure 525 is different from the structure 320 of FIG. 3E, where the insulating material SIN are removed completely.

FIG. 5G shows a structure 530 after depositing, e.g., using CVD, a conductive material (e.g., a metal W) to fill spaces left between the insulating layers OX 502. The conductive material forms conductive layers 532 between the insulating layers 502. The conductive material can form a gate for the memory cell 514. The conductive layer 532 can form a word line (WL) connecting to the gates of the memory cells 514. This step can be also called as gate replacement, e.g., replacing the insulating layer 504 with the conductive layer 532. However, as illustrated in FIG. 5G, as the SIN residue 526 remains in the middle unit 518, the conductive material cannot replace the SIN residue 526, which makes the memory cells 514 in the middle unit 518 are isolated from each other and cannot be selected together with an SSL.

FIGS. 5H to 5K describe forming CSLs 546 in the SLTs 522, which are similar to what are described in FIGS. 3G to 3I. To insulate the conductive layers (or the word lines) 532 from the CSLs 546 to be formed in the SLT 522, as illustrated in FIG. 5H, the conductive material (e.g., W) around the SLT 522 is etched, e.g., by wet etching. In a formed structure 535, a gap within the isolating layer OX 521 can be narrower than a gap below the isolating layer OX 521.

After the conductive material around the SLT 522 is etched away, an insulating material, e.g., OX, is deposited around the SLT 522. As illustrated in a structure 540 of FIG. 5I, a thin insulating layer 542 separates the SLT 522 from the conductive layers 532. FIGS. 5J and 5K show a structure 545 after forming common source lines (CSLs) 546 in the SLTs 522 by depositing (e.g., CVD) a conductive material in the SLTs 522. FIG. 5J shows a cross-sectional view of a plane crossing the VCs 512, and FIG. 5K shows a cross-sectional view of a plane crossing Oxide material, where the middle unit 518 is still filled with the SIN residue 526. The SSL cuts 516 extend through three conductive layers which become SSL 548 in the top part. However, as the middle unit 518 is not conductive, the middle unit 518 cannot be selected by a corresponding SSL 548, which is different from the middle unit 348 in FIG. 3K. Thus, the 3D structure 350 of FIG. 3K can have a better performance than the 3D structure 545 of FIG. 5K.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. A semiconductor device comprising:
a three-dimensional (3D) array of memory cells; and
a plurality of common source lines (CSLs) configured to separate the 3D array of memory cells into a plurality of portions, each portion of the plurality of portions being between two adjacent CSLs and comprising:
a plurality of conductive layers separated from each other by insulating layers; and
a plurality of vertical channels arranged orthogonally through the plurality of conductive layers and the insulating layers, each of the plurality of vertical channels comprising a string of memory cells,
wherein a top part of each portion of one or more portions of the plurality of portions comprises at least two string select line (SSL) cuts configured to separate the portion into multiple independent units, and wherein each of the multiple independent units is selectable by a corresponding SSL of multiple SSLs, and
wherein, for each portion of the one or more portions, each SSL cut of the at least two SSL cuts comprises an insulating material and configured to separate two adjacent units of the portion, and wherein a top part of at least one vertical channel of the plurality of vertical channels is covered by a corresponding SSL cut of the at least two SSL cuts and filled with the insulating material of the corresponding SSL cut.

2. The semiconductor device of claim 1, wherein, for each portion of the one or more portions, each SSL cut of the at least two SSL cuts, extends continuously along a direction without separation by one or more vertical channels along the direction in the portion.

3. The semiconductor device of claim 2, wherein top parts of the one or more vertical channels are covered by the SSL cut and filled with the insulating material of the SSL cut along the direction in the portion.

4. The semiconductor device of claim 1, wherein, for each portion of the one or more portions, each SSL cut of the at least two more SSL cuts extends to a depth of the top part of the portion but not beyond a bottom insulating layer, the SSL cut being arranged orthogonally through one or more conductive layers above the bottom insulating layer.

5. The semiconductor device of claim 4, wherein each of the one or more conductive layers is a respective SSL of the multiple SSLs and configured to select a corresponding unit of the multiple independent units.

6. The semiconductor device of claim 4, wherein memory cells in a conductive layer above the bottom insulating layer are separated into the multiple independent units by the SSL cuts, and
wherein memory cells in a conductive layer below the bottom insulating layer are conductively connected without separation by the SSL cuts.

7. The semiconductor device of claim 1, further comprising a common conductive layer on a substrate,
wherein the plurality of CSLs and the plurality of vertical channels are conductively coupled to the common conductive layer on the substrate.

8. The semiconductor device of claim 1, wherein each string of memory cells is conductively coupled to a respective bit line through a conductive via, and
wherein each of the plurality of vertical channels comprises a respective bit line pad conductively coupled to a corresponding conductive via.

9. The semiconductor device of claim 1, wherein a width of each of the CSLs is larger than a width of each of the SSL cuts.

10. A semiconductor device comprising:
a three-dimensional (3D) array of memory cells; and
a plurality of common source lines (CSLs) configured to separate the 3D array of memory cells into a plurality of portions, each portion of the plurality of portions being between two adjacent CSLs and comprising:
a plurality of conductive layers separated from each other by insulating layers; and
a plurality of vertical channels being arranged orthogonally through the plurality of conductive layers and the insulating layers, each of the plurality of vertical channels comprising a string of memory cells,
wherein a top part of each portion of one or more portions of the plurality of portions comprises one or more string select line (SSL) cuts configured to separate the portion into multiple independent units, and
wherein each SSL cut of the one or more SSL cuts comprises an insulating material and configured to separate two adjacent units of the portion, and wherein a top part of at least one vertical channel of the plurality of vertical channels is covered by a corresponding SSL cut of the one or more SSL cuts and filled with the insulating material of the corresponding SSL cut.

11. A method of forming a semiconductor device, the method comprising:
- forming a plurality of vertical channels through a plurality of alternating pairs of first and second layers on a substrate, the first layers being electrically insulating;
- forming a plurality of source line trenches (SLTs) to separate the plurality of vertical channels into a plurality of portions, each portion of the plurality of portions being between two adjacent SLTs;
- forming conductive layers between adjacent first layers in each portion of the plurality of portions by replacing the second layers with a conductive material between the adjacent first layers; then
- forming one or more string select line (SSL) cuts in a top part of each portion of one or more portions of the plurality of portions, the one or more SSL cuts being configurable to separate the portion into multiple independent units,
- wherein each SSL cut of the one or more SSL cuts comprises an insulating material and configured to separate two adjacent units of the portion, and wherein a top part of at least one vertical channel of the plurality of vertical channels is covered by a corresponding SSL cut of the one or more SSL cuts and filled with the insulating material of the corresponding SSL cut.

12. The method of claim 11, further comprising:
- forming a plurality of common source lines (CSLs) in the plurality of SLTs,
- wherein forming the one or more SSL cuts in the top part of each portion of the one or more portions comprises:
  - after forming the plurality of CSLs, forming the one or more SSL cuts in the top part of the portion between two corresponding adjacent CSLs, each of the one or more SSL cuts being configurable to separate two adjacent independent units in the portion.

13. The method of claim 12, wherein forming the plurality of CSLs in the plurality of SLTs comprises:
- etching the conductive material around the plurality of SLTs;
- depositing a second insulating material into interior areas of the plurality of SLTs; and
- depositing the conductive material in the SLTs to form the plurality of CSLs, wherein the second insulating material is configured to isolate the CSLs from the conductive layers.

14. The method of claim 11, wherein forming the one or more SSL cuts in the top part of each portion of the one or more portions comprises:
- etching the top part of the portion to form one or more openings corresponding to the one or more SSL cuts; and
- filling the insulating material into the one or more openings to form the one or more SSL cuts.

15. The method of claim 14,
- wherein etching the top part of the portion to form the one or more openings corresponding to the one or more SSL cuts comprises:
  - etching a top part of one or more vertical channels corresponding to the one or more SSL cuts, and
- wherein filling the insulating material into the one or more openings to form the one or more SSL cuts comprises:
  - filling the insulating material the top part of the one or more vertical channels.

16. The method of claim 11, wherein, for each portion of the one or more portions, each SSL cut extends to a depth of the top part of the portion but not beyond a bottom first layer in the top part,
- wherein the SSL cut is arranged orthogonally through one or more conductive layers of the conductive layers above the bottom first layer, and
- wherein each of the one or more conductive layers forms a respective SSL of multiple SSLs and configured to select a corresponding unit of the multiple independent units.

17. The method of claim 16, wherein forming the one or more SSL cuts in the top part of each portion of the one or more portions comprises:
- forming the one more SSL cuts to separate memory cells in the one or more conductive layers above the bottom first layer into the multiple independent units, and
- wherein memory cells in a conductive layer below the bottom first layer are conductively connected without separation by the SSL cuts.

18. The method of claim 11, wherein forming the plurality of vertical channels through a plurality of alternating pairs of first and second layers comprises:
- vertically etching through the plurality of alternating pairs of first and second layers to form a plurality of holes;
- forming multiple transistor layers in the plurality of holes to form strings of memory cells; and
- forming conductive bit line pads on top of the strings of memory cells.

19. The method of claim 11, wherein forming the conductive layers between the adjacent first layers in each portion of the plurality of portions comprises:
- selectively etching the second layers by flowing an etching solution from the SLTs towards the second layers to form spacings between the adjacent first layers; and
- depositing the conductive material to fill the spacings between the adjacent first layers.

* * * * *